(12) United States Patent
Choi et al.

(10) Patent No.: US 7,808,841 B2
(45) Date of Patent: Oct. 5, 2010

(54) DATA OUTPUT CIRCUIT FOR SEMICONDUCTOR MEMORY APPARATUS

(75) Inventors: Hae-Rang Choi, Ichon (KR); Kun-Woo Park, Ichon (KR); Yong-Ju Kim, Ichon (KR); Hee-Woong Song, Ichon (KR); Ic-Su Oh, Ichon (KR); Hyung-Soo Kim, Ichon (KR); Tae-Jin Hwang, Ichon (KR); Ji-Wang Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 113 days.

(21) Appl. No.: 12/169,568

(22) Filed: Jul. 8, 2008

(65) Prior Publication Data

US 2009/0067278 A1    Mar. 12, 2009

(30) Foreign Application Priority Data

Sep. 7, 2007    (KR) .................... 10-2007-0090813

(51) Int. Cl.
*G11C 7/10* (2006.01)
*G11C 7/06* (2006.01)
*G11C 7/00* (2006.01)

(52) U.S. Cl. ............................ 365/189.05; 365/189.07; 365/189.11

(58) Field of Classification Search ............. 365/189.05
See application file for complete search history.

(56) References Cited

U.S. PATENT DOCUMENTS

| | | | |
|---|---|---|---|
| 5,945,851 A * | 8/1999 | Tu et al. | 327/65 |
| 6,140,841 A * | 10/2000 | Suh | 326/60 |
| 6,211,698 B1 * | 4/2001 | Suh | 326/60 |
| 6,710,617 B2 * | 3/2004 | Humphrey | 326/30 |
| 6,772,351 B1 * | 8/2004 | Werner et al. | 713/300 |
| 7,072,415 B2 * | 7/2006 | Zerbe et al. | 375/286 |
| 7,124,221 B1 | 10/2006 | Zerbe et al. | |

(Continued)

FOREIGN PATENT DOCUMENTS

KR    10-1998-0067319    10/1998

(Continued)

*Primary Examiner*—Son L Mai
(74) *Attorney, Agent, or Firm*—Baker & McKenzie LLP

(57) ABSTRACT

A data output circuit for a semiconductor memory apparatus includes a driver control signal generating unit that has a plurality of control signal generating units, each of which generates a driver unit control signal in response to a test signal during a test, and generates the driver unit control signal according to whether or not a fuse is cut after the test is completed, a first driver that has a plurality of driver units, each of which is activated in response to the driver unit control signal to drive a first data signal as an input signal and to output the driven first data signal to an output node, a signal combining unit that generates a first driver control signal in response to the driver unit control signal and an enable signal, and a second driver that has a plurality of driver units, each of which is activated in response to the first driver control signal to drive a second data signal as an input signal and to output the driven second data signal to the output node, and the number of driver units being two or more times as much as the number of driver units in the first driver. A voltage level on the output node is the voltage level of an output signal.

11 Claims, 5 Drawing Sheets

U.S. PATENT DOCUMENTS

| | | | |
|---|---|---|---|
| 7,221,182 B2 * | 5/2007 | Choi | 326/26 |
| 7,251,169 B2 * | 7/2007 | Takeuchi | 365/189.09 |
| 7,269,212 B1 * | 9/2007 | Chau et al. | 375/229 |
| 7,308,058 B2 | 12/2007 | Zerbe et al. | |
| 7,339,429 B2 * | 3/2008 | Maki | 330/253 |
| 7,365,570 B2 | 4/2008 | King | |
| 7,577,050 B2 * | 8/2009 | Kim et al. | 365/201 |
| 2002/0075968 A1 * | 6/2002 | Zerbe et al. | 375/286 |
| 2009/0168549 A1 * | 7/2009 | Jeon | 365/189.05 |
| 2009/0231930 A1 * | 9/2009 | Kang et al. | 365/189.07 |

FOREIGN PATENT DOCUMENTS

| | | |
|---|---|---|
| KR | 1019990048862 A | 7/1999 |
| KR | 1020070036473 A | 4/2007 |

* cited by examiner

DATA OUTPUT CIRCUIT FOR SEMICONDUCTOR MEMORY APPARATUS

CROSS-REFERENCES TO RELATED APPLICATION

The present application claims priority under 35 U.S.C. 119(a) to Korean application number 10-2007-0090813, filed on Sep. 7, 2007, the content of which is incorporated herein in its entirety by reference as if set forth in full.

BACKGROUND

1. Technical Field

The embodiments described herein relate to a semiconductor memory apparatus, and in particular, to a data output circuit for a semiconductor memory apparatus.

2. Related Art

In conventional semiconductor memory apparatus, a given modulation scheme, for example, PAM (Phase Amplitude Modulation), is used in order to implement high-speed operation. For example, in a 2-PAM mode, two voltage levels are used to encode data, and in a 4-PAM mode, four voltage levels are used to encode data.

As shown in FIG. 1, a conventional 4-PAM mode data output circuit includes a first output driver 10 and a second output driver 20. The first output driver 10 includes first and second resistive elements R1 and R2, and first to third transistors N1 to N3. The second output driver 20 includes fourth to sixth transistors N4 to N6.

The first to third transistors N1 to N3 of the first output driver 10 have a different size from the fourth to sixth transistors N4 to N6 of the second output driver 20. Accordingly, the amount of current supplied to a ground terminal VSS through the first transistor N1 of the first output driver 10 is different from the amount of current supplied to the ground terminal VSS through the fourth transistor N4 of the second output driver 20.

It is assumed that the amount of current supplied to the ground terminal VSS through the first transistor N1 of the first output driver 10 is "I", and the amount of current supplied to the ground terminal VSS through the fourth transistor N4 of the second output driver 20 is "n*I".

An output signal 'OUT' is output based on a first data signal 'Data0' and a second data signal 'Data1'. The voltage of the output signal 'OUT' is as follows. In this case, a first inverted data signal 'Data0_B' is an inverted signal of the first data signal 'Data0', and a second inverted data signal 'Data1_B' is an inverted signal of the second data signal 'Data1'.

If the first data signal 'Data0' and the second data signal 'Data1' are both at low level, then the voltage level of the output signal 'OUT' is at VDD-R2*(I+nI).

If the first data signal 'Data0' is at a low level and the second data signal 'Data1' is at a high level, then the voltage level of the output signal 'OUT' is at VDD-R2*I.

If the first data signal 'Data0' is at a high level and the second data signal 'Data1' is at a low level, then the voltage level of the output signal 'OUT' is at VDD-R2*nI.

If the first data signal 'Data0' and the second data signal 'Data1' are both at a high level, the voltage level of the output signal 'OUT' is at VDD.

In this way, the output signal 'OUT' can comprise four voltage levels and is referred to as a 4 PAM (Phase Amplitude Modulation) mode.

A conventional data output circuit changes the levels of the gate voltages of the first and fourth transistors N1 and N4 to control the amount of current to be supplied to the ground terminal VSS, thereby varying the voltage level of the output signal 'OUT'. However, when the levels of the gate voltages of the first and fourth transistor N1 and N4 are changed to control the amount of current to be supplied to the ground terminal VSS, it is difficult to linearly control the amount of current to be supplied to the ground terminal VSS. Accordingly, it is difficult to linearly vary the voltage level of the output signal 'OUT'.

SUMMARY

A data output circuit for a semiconductor memory apparatus that can linearly control the voltage level of an output signal, thereby increasing a variable range of the output signal, is described herein.

According to one aspect, a data output circuit for a semiconductor memory apparatus includes a driver unit control signal generating unit that has a plurality of control signal generating units, each of which generates a driver unit control signal in response to a test signal during a test, and generates the driver unit control signal according to whether or not a fuse is cut after the test is completed, a first driver that has a plurality of driver units, each of which is activated in response to the driver unit control signal to drive a first data signal as an input signal and to output the driven first data signal to an output node, a signal combining unit that generates a first driver control signal in response to the driver unit control signal and an enable signal, and a second driver that has a plurality of driver units, each of which is activated in response to the first driver control signal to drive a second data signal as an input signal and to output the driven second data signal to the output node, and the number of driver units being two or more times as much as the number of driver units in the first driver. A voltage level on the output node is the voltage level of an output signal.

According to another aspect, a data output circuit for a semiconductor memory apparatus includes a first driver that decreases, in response to a first data signal, a voltage level on an output node by a predetermined amount; and a second driver that decreases, in response to a second data signal, the voltage level on the output node by two or more times as much as the decreased amount of the voltage level on the output node by the first driver.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
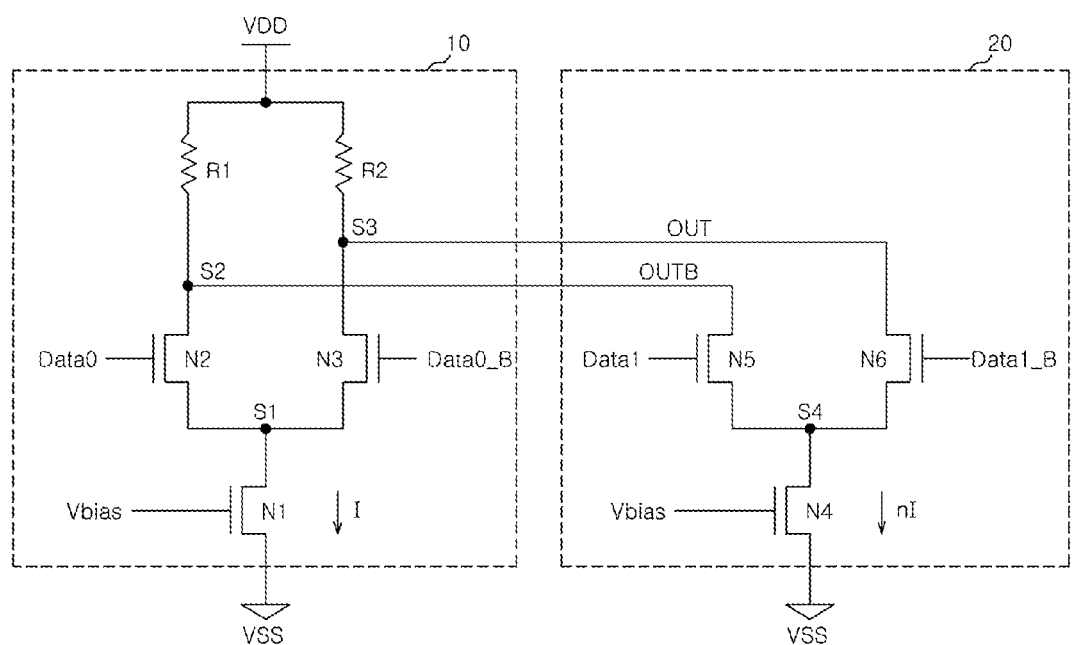
FIG. 1 is a circuit diagram illustrating a data output circuit for a conventional semiconductor memory apparatus.
Figure 2:
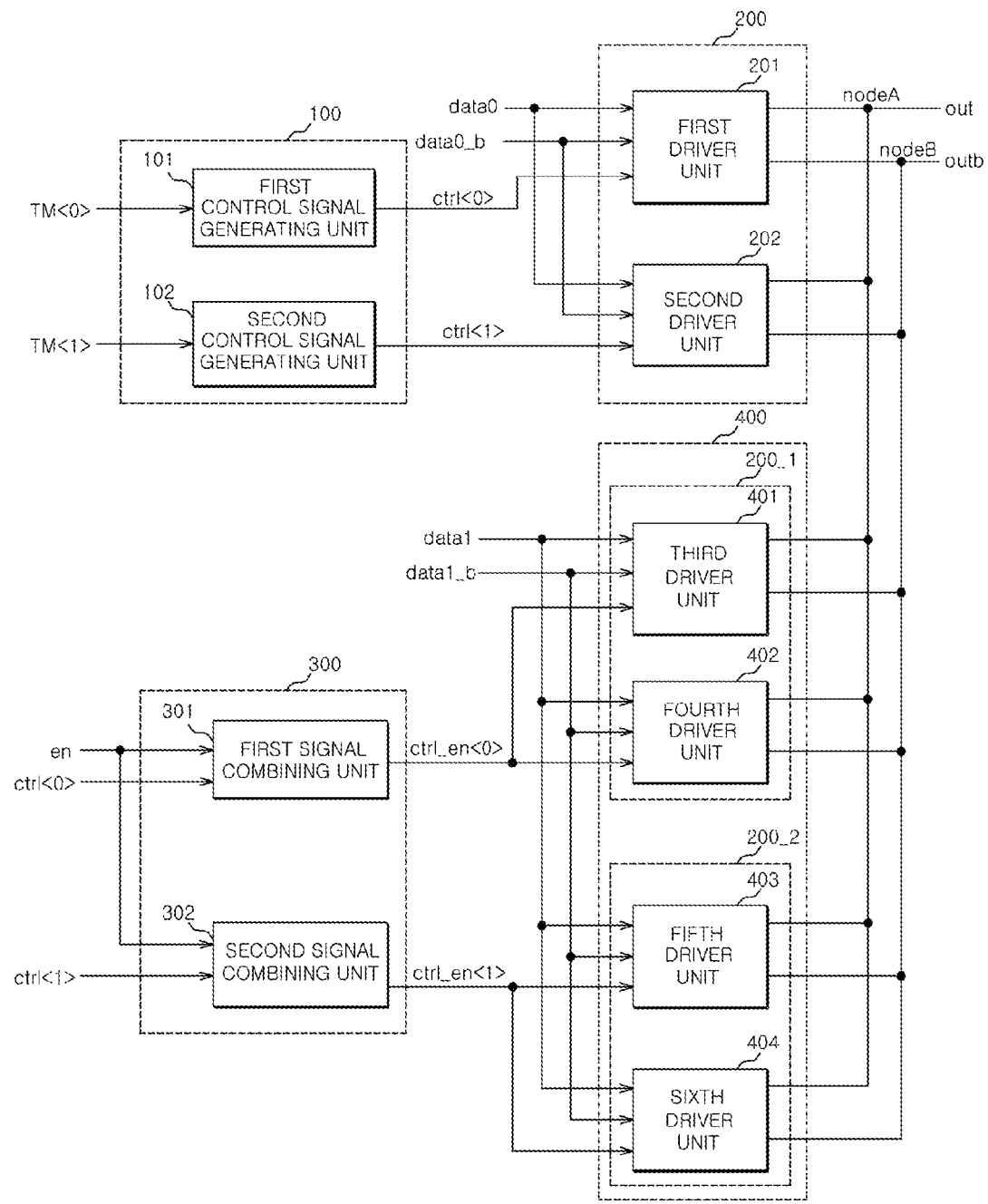
FIG. 2 is a block diagram illustrating a data output circuit for a semiconductor memory apparatus according to one embodiment.

As shown in FIG. 2, a data output circuit for a semiconductor memory apparatus according to one embodiment can include a driver control signal generating unit 100, a first driver 200, a signal combining unit 300, and a second driver 400. The first driver 200 can include two driver units 201 and 202, and the second driver 400 can include four driver units 401 to 404.

The driver unit control signal generating unit 100 can be configured to generate first and second driver unit control signals 'ctrl<0>' and 'ctrl<1>' during a test and in response to first and second test signals 'TM<0>' and 'TM<1>'. In addition, the driver control signal generating unit 100 can be configured to generate the first and second driver unit control signals 'ctrl<0>' and 'ctrl<1>' according to whether or not fuses are cut after the test is completed.

The driver control signal generating unit 100 can include first and second control signal generating units 101 and 102.

The first control signal generating unit 101 can be configured to generate, in response to the first test signal 'TM<0>', the first driver unit control signal 'ctrl<0>' during the test. In addition, the first control signal generating unit 102 can be configured to generate the first driver unit control signal 'ctrl<0>' according to whether or not the fuse is cut after the test is completed.

The second control signal generating unit 102 can be configured to generate the second driver unit control signal 'ctrl<1>' during the test and in response to the second test signal 'TM<1>'. The second control signal generating unit 102 can be configured to generate the second driver unit control signal 'ctrl<1>' according to whether or not the fuse is cut after the test is completed. In this example embodiment, the first and second control signal generating units 101 and 102 can have the same internal structure, except that different input signals 'TM<0>' and 'TM<1>' are input and different output signals 'ctrl<0>' and 'ctrl<1>' are output from each. For ease of explanation, a description will only be given for the first control signal generating unit 101, but the same can be applied to the second control signal generating unit 102.

Figure 3:
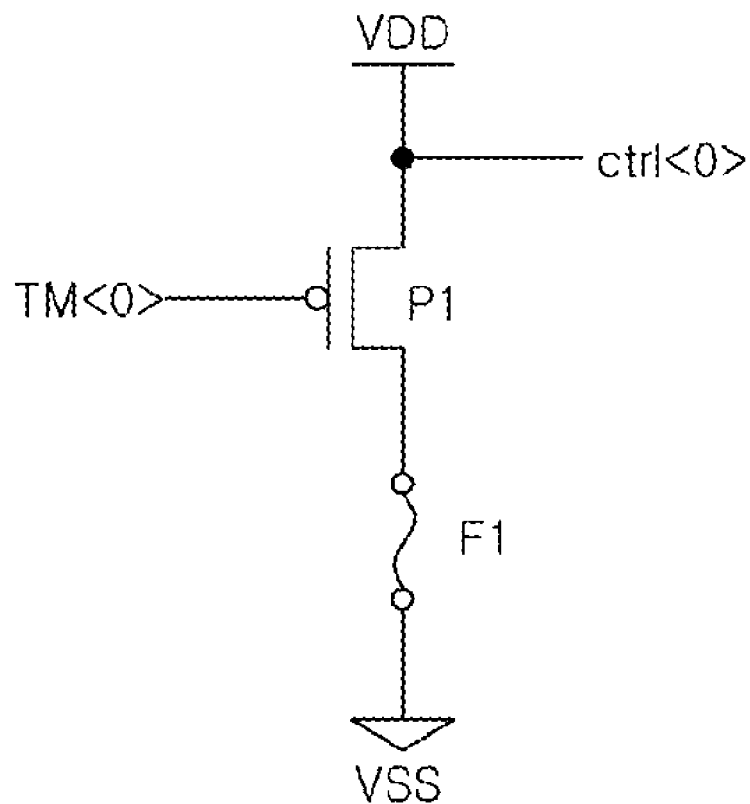
FIG. 3 is a circuit diagram illustrating a control signal generating unit that can be included in the apparatus shown in FIG. 2.

As shown in FIG. 3, the first control signal generating unit 101 can include a first transistor P1 and a fuse F1. The first transistor P1 can have a gate, to which the first test signal 'TM<0>' is input, and a source, to which an external voltage VDD is applied. One end of the fuse F1 can be connected a drain of the first transistor P1, and the other end thereof can be connected to a ground terminal VSS. In this case, the first driver unit control signal 'ctrl<0>' can be output from the source of the first transistor P1.

In the first control signal generating unit 101, the fuse F1 is not cut during the test. Accordingly, the first control signal generating unit 101 can generate, in response to the first test signal 'TM<0>', the first driver unit control signal 'ctrl<0>'. If the test is completed, then the first test signal 'TM<0>' can be a low level signal, and the first control signal generating unit 101 can be configured to generate the first driver unit control signal 'ctrl<0>' according to whether or not the fuse F1 is cut.

The first driver 200 includes first and second driver units 201 and 202.

The first driver unit 201 can be activated in response to the first driver unit control signal 'ctrl<0>'. The activated first driver unit 201 can be configured to drive a first data signal 'data0' and a first inverted data signal 'data0_b', and output the driven first data signal 'data0' and the driven first inverted data signal 'data0_b' to first and second output nodes nodeA and nodeB.

The second driver unit 202 can be activated in response to the second driver unit control signal 'ctrl<1>'. The activated second driver unit 202 can be configured to drive the first data signal 'data0' and the first inverted data signal 'data0_b', and output the driven first data signal 'data0' and the driven first inverted data signal 'data0_b' to the first and second output node nodeA and nodeB. In this example, the first driver unit 201 and the second driver unit 202 can have the same internal structure, except that they can be activated in response to different driver unit control signals 'ctrl<0>' and 'ctrl<1>', respectively.

For ease of description, a description will only be given for the internal structure of the first driver unit 201, but the same can be applied to the internal structure of the second driver unit 202 are all activated.

Figure 4:
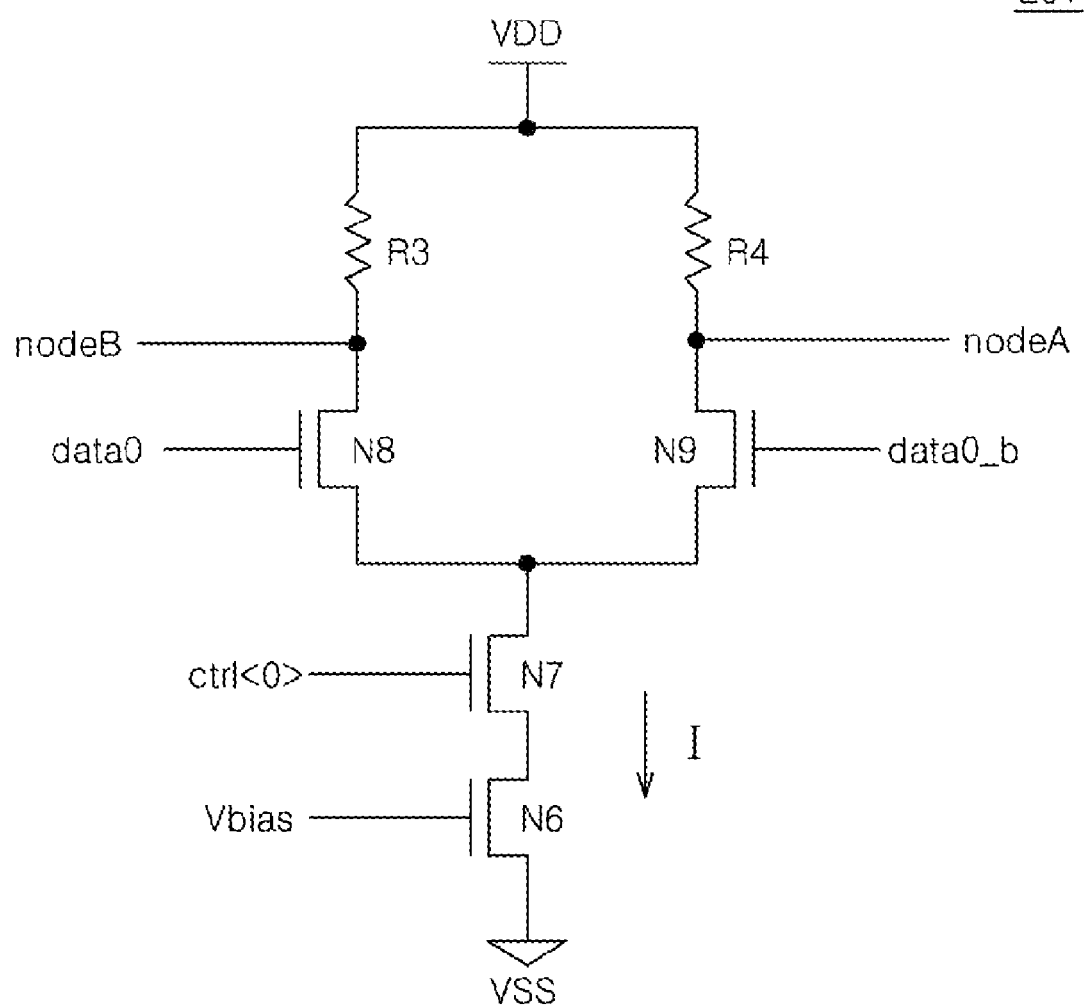
FIG. 4 is a circuit diagram illustrating a driver unit that can be included in the apparatus shown in FIG. 2.

As shown in FIG. 4, the first driver unit 201 can include first and second resistive elements R3 and R4, and second to fifth transistors N6 to N9. The external voltage VDD can be applied to one end of the first resistive element R3 and one end of the second resistive element R4. The second transistor N6 can have a gate, to which a bias voltage Vbias is applied and a source connected to the ground terminal VSS. The third transistor N7 can have a gate, to which the first driver unit control signal 'ctrl<0>' is input, and a source connected to a drain of the second transistor N6. The fourth transistor N8 can have a gate, to which the first data signal 'data0' is input, a drain connected to the other end of the first resistive element R3, and a source connected to a drain of the third transistor N7. The fifth transistor N9 can have a gate, to which the first inverted data signal 'data0'_b is input, a drain connected to the other end of the second resistive element R4, and a source connected to the drain of the third transistor N7.

In this example embodiment, a node between the second resistive element R4 and the fifth transistor N9 becomes the first output node nodeA. A node between the first resistive element R3 and the fourth transistor N8 becomes the second output node nodeB.

When the first driver unit 201, having the above-described structure, is activated in response to the first driver unit control signal 'ctrl<0>' when the first data signal 'data0' is at a high level, then the voltage level of the second output node nodeB is decreased by a predetermined amount. That is, part of the current flowing through the second output node nodeB flows into the ground terminal VSS under such conditions.

The signal combining unit 300 includes first and second combining units 301 and 302.

The first combining unit 301 can be configured to generate a first combination signal 'ctrl_en<0>' that is enabled at a high level when an enable signal 'en' and the first driver unit control signal 'ctrl<0>' are both enabled at a high level.

The second combining unit 302 generates a second combination signal 'ctrl_en<1>' which is enabled at a high level when the enable signal 'en' and the second driver unit control signal 'ctrl<1>' are both enabled at a high level.

If the semiconductor memory apparatus operates in the 2-PAM mode, then the enable signal 'en' is disabled at a low level. In addition, if the semiconductor memory apparatus operates in the 4-PAM mode, then the enable signal 'en' is enabled at a high level.

At this time, the first and second combining units 301 and 302 can have the same internal structure, except that different signals 'ctrl<0>' and 'ctrl<1>' are input and different signals 'ctrl_en<0>' and 'ctrl_en<1>' are output by each. Accordingly, for ease of explanation, a description will only be given for the first combining unit 301, but the same can be applied to the second combining unit 302.

Figure 5:
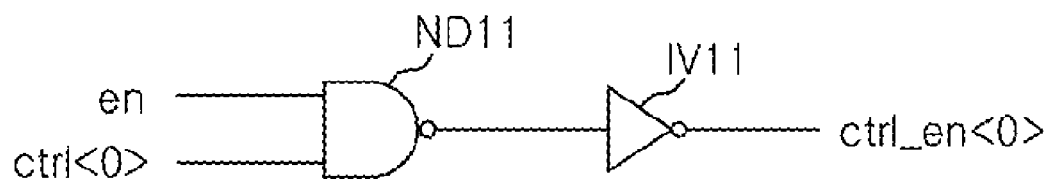
FIG. 5 is a circuit diagram illustrating a signal combining unit that can be included in the apparatus shown in FIG. 2.

As shown in FIG. 5, the first combining unit 301 can include a NAND gate ND11 and an inverter IV11. The NAND gate ND11 can receive the enable signal 'en' and the first driver unit control signal 'ctrl<0>'. The inverter IV11 can receive an output signal of the NAND gate ND11 and output the first combination signal 'ctrl_en<0>'.

The second driver 400 can include a first driver unit group 200_1 and a second driver unit group 200_2. In this example, the number of driver units in each of the first and second driver unit groups 200_1, 200_2 can be the same as the number of driver units in the first driver 200. For example, the first driver unit group 200_1 can include third and fourth driver units 401 and 402.

The third driver unit 401 can be activated in response to the first combination signal 'ctrl_en<0>'. The activated third driver unit 401 can be configured to drive a second data signal 'data1' and a second inverted data signal 'data1_b', and output the driven second data signal 'data1' and the driven second inverted data signal 'data1_b' to the first and second output nodes nodeA and nodeB.

The fourth driver unit 402 can be activated in response to the first combination signal 'ctrl_en<0>'. The activated fourth driver unit 402 can be configured to drive the second data signal 'data1' and the second inverted data signal 'data1_b', and output the driven second data signal 'data1' and the driven second inverted data signal 'data1_b' to the first and second output nodes nodeA and nodeB.

The second driver unit group 200_2 can include fifth and sixth driver units 403 and 404.

The fifth driver unit 403 can be activated in response to the second combination signal 'ctrl_en<1>'. The activated fifth driver unit 403 can be configured to drive the second data signal 'data1' and the second inverted data signal 'data1_b', and output the driven second data signal 'data1' and the driven second inverted data signal 'data1_b' to the first and second output nodes nodeA and nodeB.

The sixth driver unit 404 can be activated in response to the second combination signal 'ctrl_en<1>'. The activated sixth driver unit 404 drives the second data signal 'data1' and the second inverted data signal 'data1_b', and output the driven second data signal 'data1' and the driven second inverted data signal 'data1_b' to the first and second output nodes nodeA and nodeB.

The third to sixth driver units 401 to 404 can have the same internal structure as that of the first driver unit 201, except that different signals 'data1', 'ctrl_en<0>', and 'ctrl_en<1>' are input. The first to sixth driver units 201, 202, 401, 402, 403, and 404 have the same size, and the transistors constituting the driver units also have the same size.

The operation of the data output circuit for a semiconductor memory apparatus of FIG. 2 will now be described.

During the test, the first test signal only 'TM<0>' enabled at a high level.

The driver control signal generating unit 100 can be configured to only enable the first driver unit control signal 'ctrl<0>'.

If the first driver unit control signal 'ctrl<0>' is enabled, the first driver unit 201 of the first and second driver units 201 and 202 in only the first driver 200 is activated.

When the semiconductor memory apparatus operates in the 2-PAM mode, and the first driver unit control signal 'ctrl<0>' is enabled, the first and second combination signals 'ctrl_en<0>' and 'ctrl_en<1>' are both disabled. Accordingly, the third to sixth driver units 401 to 404 in the second driver 400 are all deactivated.

If the semiconductor memory apparatus operates in the 4-PAM mode, and only the first driver unit control signal 'ctrl<0>' is enabled, then only the first combination signal 'ctrl_en<0>' is enabled. Accordingly, the third and fourth driver units 401 and 402 of the third to sixth driver units 401 to 404 in the second driver 400 are deactivated.

Next, during the test, the first and second test signals 'TM<0>' and 'TM<1>' are both enabled.

The driver control signal generating unit 100 can be configured to enable all the first and second driver unit control signals 'ctrl<0>' and 'ctrl<1>'.

If the first and second driver unit control signals 'ctrl<0>' and 'ctrl<1>' are all enabled, then the first and second driver units 201 and 202 in the first driver 200 are both activated.

If the semiconductor memory apparatus operates in the 2-PAM mode, and the first and second driver unit control signals 'ctrl<0>' and 'ctrl<1>' are both enabled, then the first and second combination signals 'ctrl_en<0>' and 'ctrl_en<1>' are both disabled. Accordingly, the third to sixth driver units 401 to 404 are all deactivated.

If the semiconductor memory apparatus operates in the 4-PAM mode, and the first and second driver unit control signals 'ctrl<0>' and 'ctrl<1>' are both enabled, then the first and second combination signals 'ctrl_en<0>' and 'ctrl_en<1>' are both enabled. Accordingly, the third to sixth driver units 401 to 404 are all activated.

When the data output circuit for a semiconductor memory apparatus operates in the above-described manner, the voltage level of the output signal out is as follows. As described above, since all of the elements in the first to sixth driver units 201, 202, and 401 to 404 have the same size, the first to sixth driver units 201, 202, and 401 to 404 each supply the same amount of current to the ground terminal VSS.

If the semiconductor memory apparatus operates in the 2-PAM mode, and only the first driver unit 201 is activated, when the first data signal 'data0' is at a low level, then the voltage level of the output signal out is at VDD-R*I. At this time, VDD denotes the external voltage to be applied to the driver units 201, 202, and 401 to 404, R denotes resistance of the resistive element in each of the driver units 201, 202, and 401 to 404, and I denotes the amount of current to be supplied by each of the driver units 201, 202, and 401 to 404 to the ground terminal VSS.

If the first data signal 'data0' is at a high level, the voltage level of the output signal 'out' is at VDD.

If the semiconductor memory apparatus operates in the 2-PAM mode, and the first and second driver units 201 and 202 are only activated, when the first data signal 'data0' is at a low level, the voltage level of the output signal 'out' is at VDD-2*R*I.

When the first data signal 'data0' is at a high level, the voltage level of the output signal 'out' is at VDD.

If the semiconductor memory apparatus operates in the 4-PAM mode, and the first driver unit 201, the third driver unit 401, and the fourth driver unit 402 are only activated, when the first data signal 'data0' and the second data signal data1 are both at a low level, the voltage level of the output signal 'out' is at VDD-3*R*I.

When the first data signal 'data0' is at a low level and the second data signal 'data1' is at a high level, the voltage level of the output signal 'out' is at VDD-R*I.

When the first data signal 'data0' is at a high level and the second data signal 'data1' is at a low level, then the voltage level of the output signal 'out' is at VDD-2*R*I.

When the first data signal 'data0' and the second data signal 'data1' are both at a high level, then the voltage level of the output signal 'out' is at VDD.

If the semiconductor memory apparatus operates in the 4-PAM mode, and the first to sixth driver units 201, 202, and 401 to 404 are all activated, then when the first data signal 'data0' and the second data signal 'data1' are both at a low level, then the voltage level of the output signal 'out' is at VDD-6*R*I.

When the first data signal 'data0' is at a low level and the second data signal 'data1' is at a high level, then the voltage level of the output signal 'out' is at VDD-2R*I.

When the first data signal 'data0' is at a high level and the second data signal 'data1' is at a low level, then the voltage level of the output signal 'out' is at VDD-4*R*I.

When the first data signal 'data0' and the second data signal 'data1' are both at a high level, then the voltage level of the output signal 'out' is at VDD.

As described above, when the data output circuit for a semiconductor memory apparatus configured according to the embodiments described herein operates in the 4-PAM mode, then the voltage level of the output signal is adjusted by means of the driver units, which drive the first data signal, and the driver units, which drive the second data signal. In this case, the number of driver units which drive the second data signal is two or more times as much as the number of driver units that drive the first data signal. But this is just for illustration. It will be apparent that the number of driver units configured to drive the second data signal can be an integer multiple, for example, three times, four times, or the like, of the number of driver units that drive the first data signal. In addition, the driver unit control signal that is activated by the test signal during the test can be at a fixed level by cutting the fuse after the test is completed.

It will also be apparent that a data output circuit for a semiconductor memory apparatus configured according to the embodiments described herein can linearly control the voltage level of the output signal, thereby increasing the variable range of the output signal.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A data output circuit for a semiconductor memory apparatus, comprising:
    a driver control signal generating unit comprising a plurality of control signal generating units, each of which is configured to generate a driver unit control signal in response to a test signal during a test, and to generate the driver unit control signal according to whether or not a fuse is cut after the test is completed;
    a first driver comprising a plurality of driver units, each of which is activated in response to the driver unit control signal to drive a first data signal as an input signal and to output the driven first data signal to an output node;
    a signal combining unit configured to generate a first driver control signal in response to the driver unit control signal and an enable signal; and
    a second driver comprising a plurality of driver units, each of which is activated in response to the first driver control signal to drive a second data signal and to output the driven second data signal to the output node, the number of driver units being two or more times as much as the number of driver units in the first driver, wherein a voltage level on the output node is the voltage level of an output signal.

2. The data output circuit of claim 1, wherein the first driver is further configured to determine the voltage level of the output node according to the number of driver units included therein activated in response to a plurality of driver unit control signals output from the plurality of control signal generating units.

3. The data output circuit of claim 1, wherein each of the plurality of driver unit includes:
    a first transistor that has a gate to which the first data signal is input, a drain connected to a power terminal, and a source connected to a first node;
    a second transistor that has a gate to which an inverted signal of the first data signal is input, a drain connected to the power terminal, and a source connected to the first node;
    a third transistor that has a gate to which a bias voltage is applied and a source connected to a ground terminal;
    a fourth transistor that has a gate to which the driver unit control signal is input, a drain connected to the first node, and a source connected to a drain of the third transistor;
    a first resistor that is connected between the power terminal and the drain of the first transistor; and
    a second resistor that is connected to the power terminal and the drain of the second transistor.

4. The data output circuit of claim 1, wherein the signal combining unit is further configured to generate a plurality of first driver control signals in response to a plurality of driver unit control signals output from the plurality of control signal generating units and the enable signal.

5. The data output circuit of claim 4, wherein the signal combining unit includes a plurality of combining units that are configured to correspondingly generate the plurality of first driver control signals.

6. The data output circuit of claim 5, wherein each of the combining units is further configured to enable the first driver control signal when the driver unit control signal and the enable signal are both enabled.

7. The data output circuit of claim 4, wherein the second driver is configured to determine the voltage level of the output node according to the number of driver units activated in response to the plurality of first driver control signals from the signal combining units.

8. A data output circuit for a semiconductor memory apparatus, comprising:
    a first driver configured to decrease a voltage level on an output node by a predetermined amount in response to a first data signal when the first driver is activated; and
    a second driver configured to decrease the voltage level on the output node by two or more times as much as the decreased amount of the voltage level on the output node by the first driver in response to a second data signal when the second driver is activated,
    wherein each of the first and second drivers supplies an external voltage to the output node when each of the first and second drivers is inactivated.

9. The data output circuit of claim 8, wherein the first driver includes at least one first driver unit configured to decrease the voltage level on the output node by the predetermined amount in response to the first data signal.

10. The data output circuit of claim 9, wherein the second driver includes second driver units, each of which is configured to decrease the voltage level on the output node by the predetermined amount in response to the second data signal, the number of second driver units being two or more times as much as the number of first driver units in the first driver.

11. The data output circuit of claim 10, wherein the first driver unit has the same structure as the second driver unit.

* * * * *